(12) United States Patent
van der Wagt (10) Patent No.: US 7,728,650 B2
(45) Date of Patent: Jun. 1, 2010

(54) SWITCHES WITH PASSIVE BOOTSTRAP OF CONTROL SIGNAL

(75) Inventor: Jan Paul van der Wagt, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/764,039

(22) Filed: Jun. 15, 2007

(65) Prior Publication Data

US 2008/0309400 A1 Dec. 18, 2008

(51) Int. Cl.
*G06F 7/64* (2006.01)
*G06G 7/18* (2006.01)
*G06G 7/19* (2006.01)

(52) U.S. Cl. .................. 327/536; 327/91; 327/92; 327/93; 327/94; 327/95; 327/337; 327/537; 327/552; 327/553; 327/554

(58) Field of Classification Search .......... 327/589, 327/590, 337, 536
See application file for complete search history.

(56) References Cited

U.S. PATENT DOCUMENTS

| | | | |
|---|---|---|---|
| 5,084,634 A | | 1/1992 | Gorecki |
| 5,170,075 A | | 12/1992 | de Wit |
| 5,172,019 A | | 12/1992 | Naylor et al. |
| 5,461,265 A | | 10/1995 | Kunihisa et al. |
| 5,500,612 A | | 3/1996 | Sauer |
| 5,905,404 A | * | 5/1999 | Nagaraj ............... 327/589 |
| 6,593,803 B2 | * | 7/2003 | Yoshizawa ............ 327/553 |
| 7,263,337 B2 | | 8/2007 | Struble |
| 2006/0255853 A1 | * | 11/2006 | Masuko et al. ......... 327/536 |

FOREIGN PATENT DOCUMENTS

| | | |
|---|---|---|
| DE | 2851789 | 6/1980 |
| JP | 10084267 | 3/1998 |

OTHER PUBLICATIONS

International Search Report-PCT/US2008/066836, International Searching Authority-European Patent Office-Oct. 17, 2008.
Written Opinion-PCT/US2008/066836, International Searching Authority-European Patent Office-Oct. 17, 2008.
Dessouky, et al., "Very Low-Voltage Digital_Audio DS Modulator with 88-dB Dynamic Range Using Local Switch Bootstrapping," IEEE Journal of Solid-State Circuits, vol. 36, No. 3, Mar. 2001, pp. 349-355.

* cited by examiner

*Primary Examiner*—Lincoln Donovan
*Assistant Examiner*—John W Poos
(74) *Attorney, Agent, or Firm*—Jiayu Xu (57) ABSTRACT

Switches with passive bootstrap that can achieve good sampling performance are described. In one design, a sampling circuit with passive bootstrap includes first and second filters and a switch. The first filter filters an input signal and provides a filtered input signal. The second filter filters a clock signal and provides a filtered clock signal. The switch receives a control signal formed based on the filtered input signal and the filtered clock signal and either passes or blocks the input signal based on the control signal. The first filter may be a lowpass filter having a first corner frequency that is higher than the bandwidth of the input signal. The second filter may be a highpass filter having a second corner frequency that is lower than the fundamental frequency of the clock signal. The first and second filters may both be implemented with one resistor and one capacitor.

30 Claims, 8 Drawing Sheets

SWITCHES WITH PASSIVE BOOTSTRAP OF CONTROL SIGNAL

BACKGROUND

I. Field

The present disclosure relates generally to electronics circuits, and more specifically to switches.

II. Background

Switches are commonly used in various electronics circuits for various applications. For example, switches are widely used in mixed-signal integrated circuits to sample analog signals. Sampling switches may be implemented with various types of transistors such as metal oxide semiconductor field effect transistors (MOSFETs). A sampling MOSFET switch typically receives an analog signal at a source and a control signal at a gate, passes the analog signal if the switch is turned on by the control signal, and blocks the analog signal if the switch is turned off by the control signal.

The performance of a sampling switch may be characterized by an on impedance when the switch is turned on and an off impedance when the switch is turned off. Low-distortion sampling may be realized with a high off-impedance to on-impedance ratio in combination with moderate device parasitics. For a MOSFET switch, the on and off impedances are determined by the voltages of the analog signal at the source and the control signal at the gate of the switch. A particular change in voltage (e.g., more than 1 Volt) between the gate and source may be needed to achieve a high off/on impedance ratio with moderate device size for acceptable parasitics. However, as integrated circuit (IC) fabrication technology improves and transistor size shrinks, lower power supply voltage is often used to avoid oxide breakdown due to smaller transistor geometry. With the power supply voltages of modern scaled semiconductor technologies approaching 1 Volt, realization of high off/on impedance ratio for good sampling performance becomes more challenging.

There is therefore a need in the art for switches that can achieve good performance even with low power supply voltages.

SUMMARY

Switches with passive bootstrap that can achieve good sampling performance are described herein. Bootstrapping refers to adding one signal onto another signal, typically voltage-wise. Passive bootstrap may be achieved with passive circuit components instead of active circuit components and may provide certain advantages, as described below.

In one design, a sampling circuit with passive bootstrap includes first and second filters and a switch. The first filter filters an input signal and provides a filtered input signal. The second filter filters a clock signal and provides a filtered clock signal. The switch receives a control signal formed based on the filtered input signal and the filtered clock signal and either passes or blocks the input signal based on the control signal. The first filter may be a lowpass filter having a first corner frequency that is higher than the bandwidth of the input signal. The second filter may be a highpass filter having a second corner frequency that is lower than the fundamental frequency of the clock signal. The first corner frequency may be equal to the second corner frequency.

In one design, the first filter is a first-order RC filter implemented with a resistor and a capacitor. The second filter is a first-order CR filter implemented with the same resistor and capacitor used for the first filter. The resistor may be coupled between a source and a gate of the switch. The capacitor may be coupled between the gate of the switch and the clock signal. The input signal may be coupled to the source of the switch.

The control signal for the switch may be a voltage sum of the filtered input signal and the filtered clock signal. The control signal may thus have a higher voltage swing than the clock signal. A gate-to-source voltage of the switch may be non-dependent on the input signal. These characteristics may provide good switching performance and may mitigate signal dependent distortion, as described below.

Various aspects and features of the disclosure are described in further detail below.

DETAILED DESCRIPTION

The switches with passive bootstrap described herein may be used for various circuits and applications. For example, these switches may be used for sampling circuits commonly employed in mixed-signal integrated circuits operating on both analog and digital signals. These switches may also be implemented with various types of transistors such as MOSFETs, N-channel field effect transistors (N-FETs), P-channel FETs (P-FETs), bipolar junction transistors (BJTs), gallium arsenide (GaAs) FETs, etc. For clarity, switches implemented with N-FETs are described below.

Figure 1:
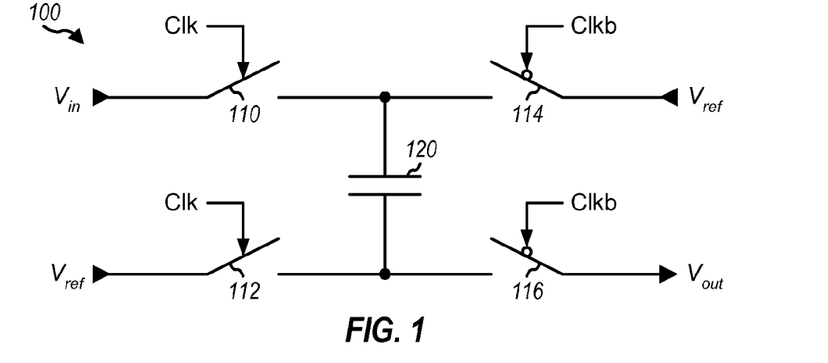
FIG. 1 shows a sampling circuit for an analog input signal.

FIG. 1 shows a schematic diagram of a sampling circuit 100 that utilizes sampling switches. Within sampling circuit 100, a switch 110 has one end receiving an analog input signal, $V_{in}$, and the other end coupled to a first node of a capacitor 120. A switch 112 has one end coupled to a reference voltage, $V_{ref}$, and the other end coupled to a second node of capacitor 120. A switch 114 has one end coupled to the reference voltage and the other end coupled to the first node of capacitor 120. A switch 116 has one end coupled to the second node of capacitor 120 and the other end providing an output signal, $V_{out}$. Switches 110 and 112 receive a clock signal, Clk, at their control inputs. Switches 114 and 116 receive a complementary clock signal, Clkb, at their control inputs.

Sampling circuit 100 operates as follows. During a first clock phase, the Clk signal is at logic high, and the Clkb signal is at logic low. Switches 110 and 112 are turned on by the logic high Clk signal, and switches 114 and 116 are turned off by the logic low Clkb signal. Capacitor 120 is charged via switches 110 and 112 to the voltage difference between the input signal and the reference voltage, or $V_{cap}=V_{in}-V_{ref}$.

During a second clock phase, the Clk signal is at logic low, and the Clkb signal is at logic high. Switches 110 and 112 are turned off by the logic low Clk signal, and switches 114 and 116 are turned on by the logic high Clkb signal. The voltage across capacitor 120 is provided via switches 114 and 116 as the output signal, or $V_{out}=V_{ref}-V_{cap}$. Since capacitor 120 is charged via the first node and discharged via the second node, the output signal is inverted with respect to the input signal. Although not shown in FIG. 1, a non-inverted output signal may be obtained by applying the reference voltage to switch 116 and taking the output from switch 114.

Sampling circuit 100 includes four switches 110, 112, 114 and 116 used to sample the input signal and provide a sampled signal as the output signal. Switch 110 typically has the most stringent performance requirements among the four switches and may be implemented as described below.

Figure 2:
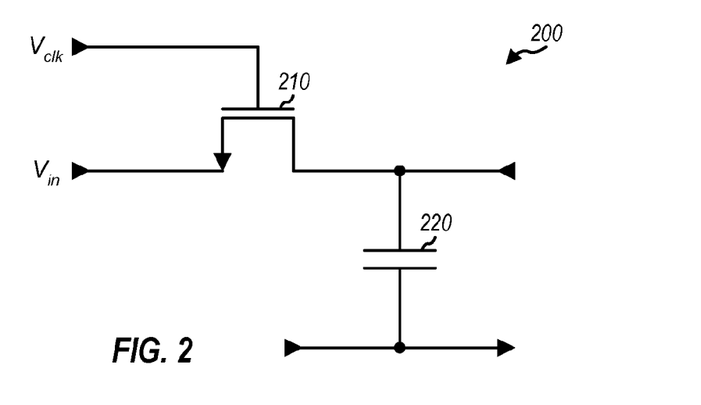
FIG. 2 shows a sampling circuit implemented with an N-FET.

FIG. 2 shows a schematic diagram of a sampling circuit 200 that may implement part of sampling circuit 100 in FIG. 1. Sampling circuit 200 includes an N-FET 210 that may implement switch 110 in FIG. 1 and a capacitor 220 that may implement capacitor 120. N-FET 210 has its source receiving an analog input signal, $V_{in}$, its gate receiving a clock signal, $V_{clk}$, and its drain coupled to the first node of capacitor 220. Capacitor 220 may be coupled to other circuit elements, e.g., as shown in FIG. 1.

The clock signal may swing from zero Volt (V) to a power supply voltage, $V_{DD}$. The input signal may be centered near $V_{DD}/2$ and may swing up or down from this center voltage. A gate-to-source voltage, $V_{gs}$, for N-FET 210 may be given as:

$$V_{gs}=V_{clk}-V_{in}. \quad\quad \text{Eq (1)}$$

N-FET 210 may be considered as a controlled resistor that varies from zero resistance toward infinite resistance based on the $V_{gs}$ voltage. The $V_{gs}$ voltage should be equal to or greater than a threshold voltage, $V_T$, in order to turn on N-FET 210. The drain-to-source resistance, $r_{ds}$, is low for $V_{gs} \geq V_T$ and decreases as $V_{gs}$ increases past $V_T$. The $r_{ds}$ resistance is high for $V_{gs}$ several 100 mV below $V_T$.

Applying the clock signal directly to the gate of N-FET 210, as shown in FIG. 2, has several disadvantages. First, the $V_{gs}$ voltage is equal to $V_{clk}-V_{in}$ instead of the full $V_{clk}$ voltage, and a gate voltage, $V_g$, of $V_{in}+V_T$ instead of just $V_T$ is needed to turn on N-FET 210. Hence, it may be difficult to obtain a sufficiently high $V_{gs}$ voltage to achieve a high off/on resistance ratio. Second, if the clock signal swings between 0V and $V_{DD}$, then $V_{gs}$ is dependent on $V_{in}$. For example, if $V_{clk}=V_{DD}=1.3V$, then $V_{gs}=0.8$ V when $V_{in}=0.5$ V and $V_{gs}=1.0$ V when $V_{in}=0.3$ V. N-FET 210 is thus turned on harder and has a lower $r_{ds}$ resistance when $V_{in}=0.3$ V than when $V_{in}=0.5$ V. This difference in $r_{ds}$ resistance for different $V_{in}$ voltages results in a signal dependent error in the charged voltage across capacitor 220. This signal dependent error causes distortion in the output signal, which is undesirable for many applications.

Figure 3:
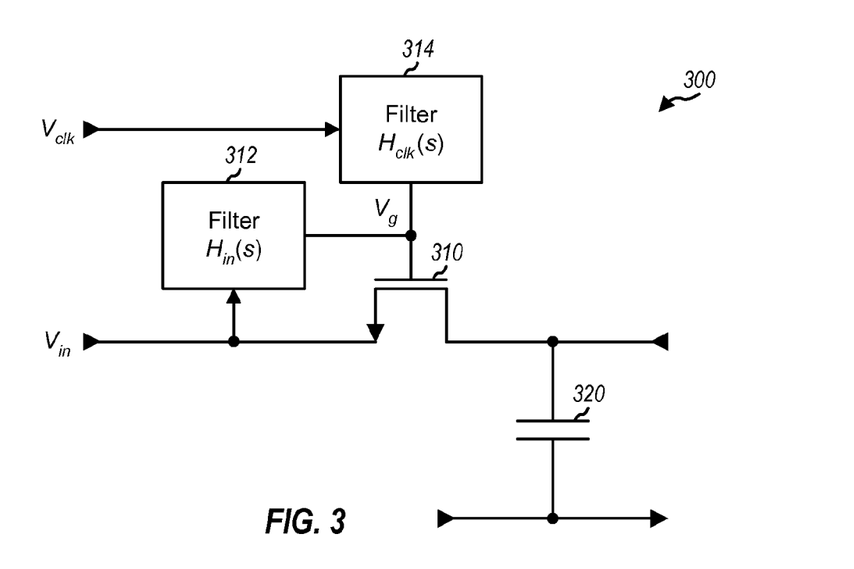
FIG. 3 shows a sampling circuit with passive bootstrap.

FIG. 3 shows a schematic diagram of a design of a sampling circuit 300 with passive bootstrap for improved switching characteristics. Sampling circuit 300 includes an N-FET 310 that may implement switch 110 in FIG. 1 and a capacitor 320 that may implement capacitor 120. N-FET 310 has its source receiving an analog input signal, its gate receiving a control signal, and its drain coupled to the first node of capacitor 320. Capacitor 320 may be coupled to other circuit elements.

A filter 312 receives and filters the input signal with a filter response of $H_{in}(s)$ and provides a filtered input signal, $V_{fin}$, to the gate of N-FET 310. A filter 314 receives and filters a clock signal with a filter response of $H_{clk}(s)$ and provides a filtered clock signal, $V_{fclk}$, to the gate of N-FET 310. The gate voltage, $V_g$, of N-FET 310 is equal to the sum of the two filtered voltages, as follows:

$$V_g=V_{fin}+V_{fclk}. \quad\quad \text{Eq (2)}$$

The gate voltage may be generated to obtain the following characteristics:

Achieve a $V_{gs}$ voltage that can turn on N-FET 310 sufficiently hard to obtain a high off/on resistance ratio, and Achieve a $V_{gs}$ voltage that is minimally dependent of the $V_{in}$ voltage in order to mitigate signal dependent error.

Filters 312 and 314 may implement various filter responses that can achieve the desired characteristics for the gate voltage. In general, filters 312 and 314 may be implemented with any passive components, e.g., resistors, capacitors, inductors, etc. Filters 312 and 314 may also be implemented with active components, e.g., transistors.

In one design, filter 312 implements a lowpass filter response, and filter 314 implements a highpass filter response. This design exploits frequency separation of the input signal and the clock signal. For a sampling switch, the input signal is typically limited to a particular signal bandwidth, $f_{BW}$. The clock signal has a particular fundamental frequency, $f_{clk}$, that may be much higher than the signal bandwidth, or $f_{clk} \gg f_{BW}$. For example, $f_{clk}$ may be four times, ten times, or more than ten times higher than $f_{BW}$.

Figure 4A:
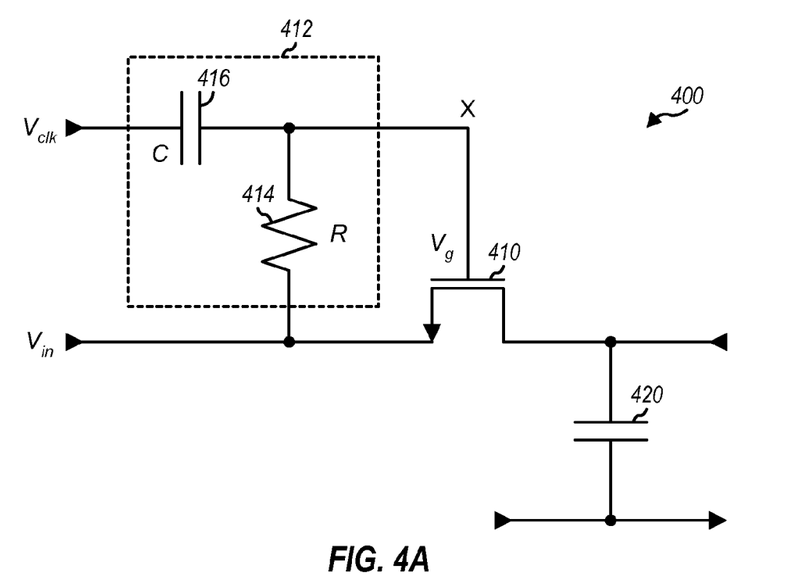
FIG. 4A shows a sampling circuit with RC passive bootstrap.

FIG. 4A shows a schematic diagram of a design of a sampling circuit 400 with passive bootstrap for improved switching characteristics. Sampling circuit 400 is one design of sampling circuit 300 in FIG. 3 and implements filter 312 with a first-order lowpass filter and filter 314 with a first-order highpass filter. Sampling circuit 400 performs bootstrapping with two simple filters, both of which may be implemented with two passive components.

Sampling circuit 400 includes an N-FET 410 that may implement switch 110 in FIG. 1, a capacitor 420 that may implement capacitor 120, and a bootstrap circuit 412. N-FET 410 has its source receiving an analog input signal, its gate coupled to a node X, and its drain coupled to the first node of capacitor 420. Capacitor 420 may be coupled to other circuit elements. Bootstrap circuit 412 includes a resistor 414 and a capacitor 416. Resistor 414 has one end receiving the input signal and the other end coupled to node X. Capacitor 416 has one end receiving a clock signal and the other end coupled to node X. The voltage at node X, which is also the $V_g$ voltage for N-FET 410, may be determined based on superposition.

Figure 4B:
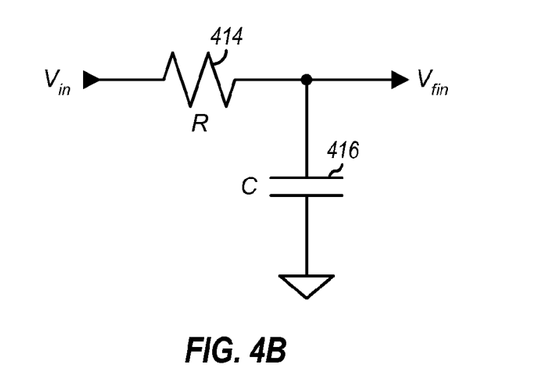
FIG. 4B shows an equivalent circuit for the input signal in FIG. 4A.

FIG. 4B shows an equivalent circuit for the input signal in FIG. 4A. In this equivalent circuit, the left end of capacitor 416 in FIG. 4A, which receives the clock signal, may be considered as being at AC ground. The lowpass filter response for the input signal may be expressed in the s-domain, as follows:

$$H_{in}(s) = \frac{1/RC}{s+1/RC}, \quad\quad \text{Eq (3)}$$

where R is the value of resistor 414 and C is the value of capacitor 416. Variable s is equal to jω for a single-frequency signal with angular frequency ω. The filtered input signal tracks the input signal with a time constant of RC.

Figure 4C:
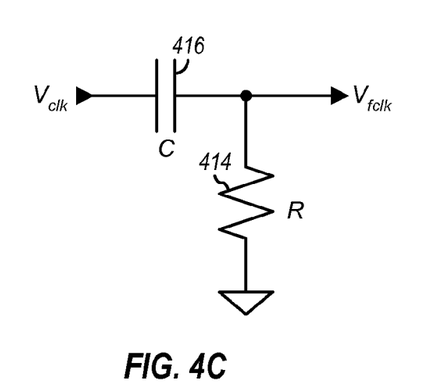
FIG. 4C shows an equivalent circuit for the clock signal in FIG. 4A.

FIG. 4C shows an equivalent circuit for the clock signal in FIG. 4A. In this equivalent circuit, the bottom end of resistor 414 in FIG. 4A, which receives the input signal, may be considered as being at AC ground. The highpass filter response for the clock signal may be expressed in the s-domain, as follows:

$$H_{clk}(s) = \frac{s}{s + 1/RC}.$$  Eq (4)

The filtered clock signal tracks the high-frequency content of the clock signal. For low frequencies, including average value, the filtered clock signal tracks the resistor node connected to ground in FIG. 4C. Here high frequency and low frequency refer to angular frequencies well above and well below 1/RC, respectively.

The voltage at node X due to both the input signal and the clock signal may be given as:

$$V_g = LPF(V_{in}) + HPF(V_{clk}),$$  Eq (5)

where LPF(X) denotes a time-domain lowpass filter function corresponding to $H_{in}(s)$, HPF(X) denotes a time-domain highpass filter function corresponding to $H_{clk}(s)$, and x denotes an input to the filter function.

In the design shown in FIG. 4A, the lowpass filter for the input signal and the highpass filter for the clock signal both have the same corner frequency of $f_c = 1/(2\pi \cdot RC)$. The values of resistor 414 and capacitor 416 may be selected such that the corner frequency is higher than the signal bandwidth (or $f_c > f_{BW}$) and is also lower than the clock frequency (or $f_c < f_{clk}$). In this case, most of the input signal may pass through the lowpass filter to node X, and most of the clock signal may pass through the highpass filter to node X.

Sampling circuit 400 operates as follows. The voltage on the right side of capacitor 416 tracks the input signal because the lowpass filter corner frequency is higher than the signal bandwidth. The left side of capacitor 416 is alternately applied 0V and $V_{DD}$ by the clock signal. Because the highpass filter corner frequency is lower than the clock frequency, the voltage on the right side of capacitor 416 is raised by $V_{DD}$ when the clock signal is at $V_{DD}$. Hence, for input frequencies below the lowpass filter corner frequency, the voltage at node X tracks the input signal and is further periodically raised by the clock signal. If $V_{clk}$ is the clock voltage relative to its average value of about $V_{DD}/2$, then the gate voltage for N-FET 410 may be approximated as:

$$V_g \approx V_{in} + V_{clk}.$$  Eq (6)

Figure 5:
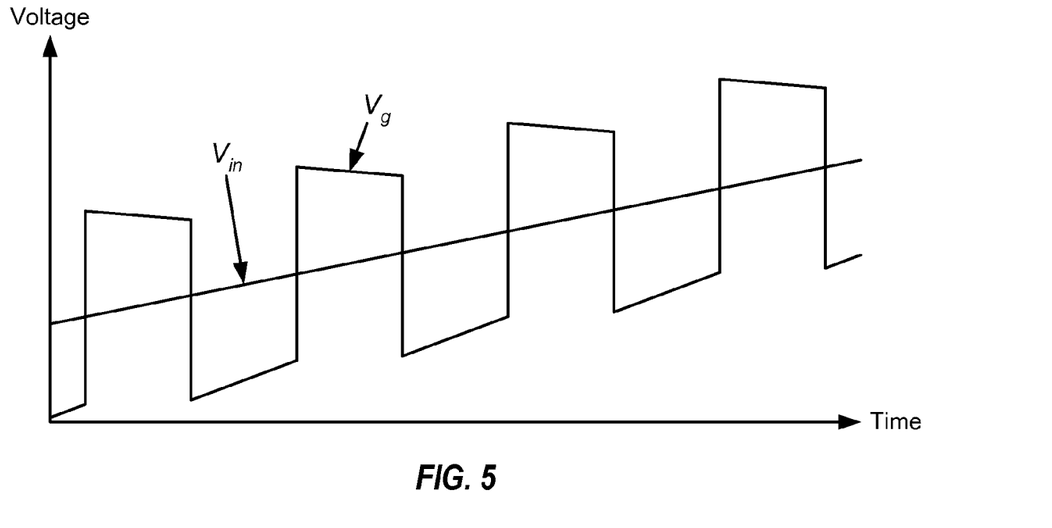
FIG. 5 shows a gate voltage for an N-FET with passive bootstrap.

FIG. 5 illustrates the gate voltage for N-FET 410 with bootstrap circuit 412 in FIG. 4A. The average gate voltage tracks the slow moving input signal. The instantaneous gate voltage tracks the fast moving clock signal. The clock signal, and especially its higher harmonics, may be passed fully to the gate of N-FET 410.

The $V_{gs}$ voltage for N-FET 410 may be approximated as:

$$V_{gs} = V_g - V_{in} \approx V_{clk}.$$  Eq (7)

As shown in equation (6) and FIG. 5, the clock signal is bootstrapped to the input signal and presented to the gate of N-FET 410. This results in a constant-overdrive switch that is driven by approximately $V_{DD}/2$ during each on clock phase and approximately $-V_{DD}/2$ during each off clock phase regardless of the voltage of the input signal. N-FET 410 thus observes similar environment regardless of the input signal voltage.

Figure 6:
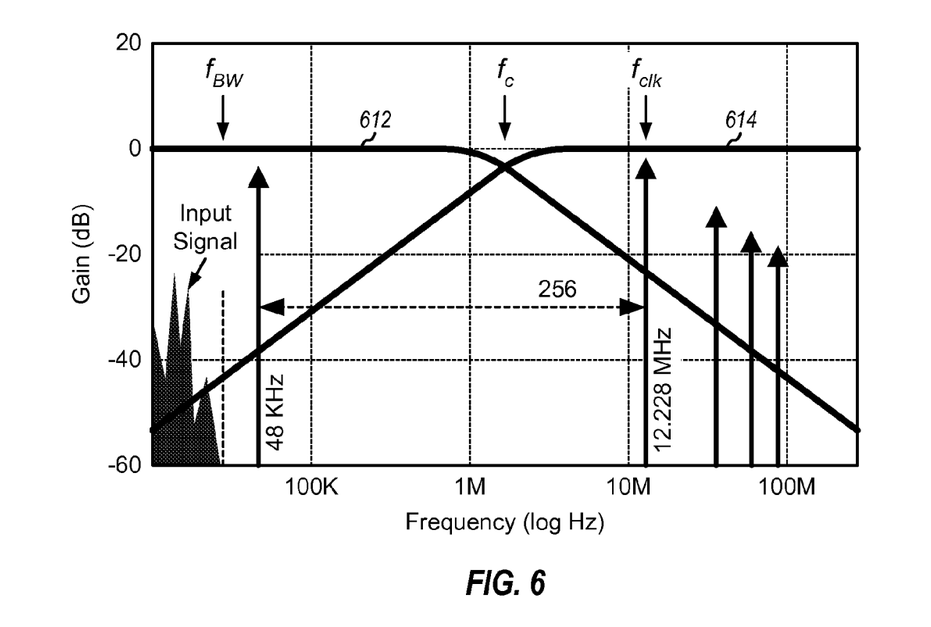
FIG. 6 shows filter responses for the passive bootstrap in FIG. 4A.

FIG. 6 shows plots of the filter responses for bootstrap circuit 412 in FIG. 4A. In this example, the input signal is an audio signal with a bandwidth of 24 kilo Hertz (KHz), and the clock signal has a fundamental frequency that is 512 times higher than the signal bandwidth, or $f_{BW}$=24 KHz and $f_{clk}$=12.288 mega Hertz (MHz). A corner frequency of approximately 1.6 MHz is selected for the lowpass and highpass filters. The lowpass filter has a frequency response shown by a plot 612, and the highpass filter has a frequency response shown by a plot 614. The lowpass and highpass filters may be implemented with a resistor of 100 kilo ohms (KΩ) and a capacitor of 1 pico Farad (pF). The input signal is well within the corner frequency, and all signal components pass through the lowpass filter. The clock frequency is much higher than the corner frequency, and most of the clock components pass through the highpass filter. The corner frequency may also be placed at some other frequency between $f_{BW}$ and $f_{clk}$.

The input signal may be coupled to the gate of N-FET 410 through a relatively large resistor, e.g., 100 KΩ. The clock signal may be coupled to the same gate through a moderate-size capacitor, e.g., 1 pF. The input signal would then pass through an RC lowpass filter to the N-FET gate. Signal components below the corner frequency would be coupled to the gate. The clock signal would pass through a CR highpass filter to the N-FET gate. Clock frequencies above the corner frequency would be coupled to the gate. The large resistor value and the periodic nature of the clock signal avoid distortion or heavy loading of the bootstrap circuit on the input signal.

A ratio of about ten or more between the clock frequency and the maximum input signal frequency may allow for easy implementation of the lowpass and highpass filters using shared circuit components, e.g., as shown in FIG. 4A. This clock-to-signal frequency ratio is normally satisfied by many circuits such as baseband receive channels and transmit coder/decoder (codec) front ends in ICs used for wireless communication. However, passive bootstrap may also be used with lower clock-to-signal frequency ratios.

The design shown in FIG. 4A has various advantages. First, the gate voltage of N-FET 410 has the same amount of overdrive relative to the input signal during each on phase of the clock signal, as shown in equation (6) and illustrated in FIG. 5. This may allow N-FET 410 to turn on sufficiently hard to achieve a high off/on resistance ratio. This may also avoid reliability issue for N-FET 410 since the peak $V_{gs}$ voltage is controlled and known. Second, since $V_g$ includes $V_{in}$, as shown in equation (6), the $V_{gs}$ voltage is not dependent on $V_{in}$, as shown in equation (7). This may result in less signal dependent error and sampling distortion. Third, the bootstrap circuit may be implemented with minimal hardware, e.g., one capacitor and one resistor. Fourth, the bootstrap circuit does not consume any power, contributes negligible noise, and is reliable due to use of passive circuit components instead of active circuit components. Fifth, the bootstrap circuit presents negligible additional loading and low parasitics on the input signal when a relatively large value is used for resistor 414. The bootstrap circuit may thus be used for high-speed switches such as radio frequency (RF) front-end switches.

Figure 7:
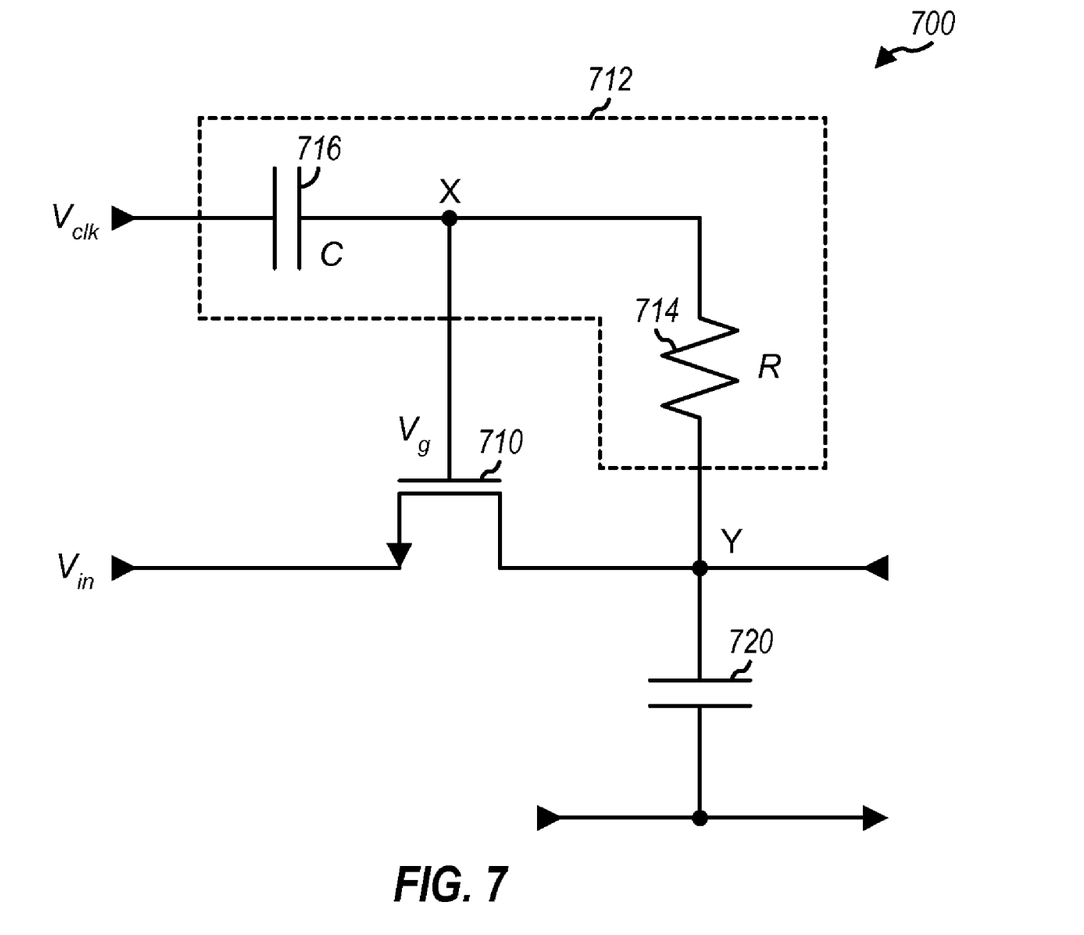
FIG. 7 shows another sampling circuit with passive bootstrap.

FIG. 7 shows a schematic diagram of a design of a sampling circuit 700 with passive bootstrap for improved switching characteristics. Sampling circuit 700 is another design of sampling circuit 300 in FIG. 3 and implements filter 312 with a first-order lowpass filter and filter 314 with a first-order highpass filter.

Sampling circuit 700 includes an N-FET 710 that may implement switch 110 in FIG. 1, a capacitor 720 that may implement capacitor 120, and a bootstrap circuit 712. N-FET 710 has its source receiving an analog input signal, its gate coupled to a node X, and its drain coupled to the first node of capacitor 720. Capacitor 720 may be coupled to other circuit elements. Bootstrap circuit 712 includes a resistor 714 and a capacitor 716. Resistor 714 has one end coupled to the drain of N-FET 710 and the other end coupled to node X. Capacitor 716 has one end receiving a clock signal and the other end coupled to node X.

In sampling circuit 700, the clock signal is passed through a highpass filter formed by capacitor 716 and resistor 714, and the filtered clock signal is presented to node X. The input signal is passed through N-FET 710 and a lowpass filter formed by resistor 714 and capacitor 716, and the filtered input signal is presented to node X. If node Y is reset to a reference voltage during half of each clock cycle, as is the case in sampling circuit 100, then only half of the bootstrapping is achieved, in the sense that the gate voltage contains only half of $V_{in}$. But if a simple voltage buffer and no reset are attached to node Y, as in a sample-and-hold circuit, then full bootstrapping is achieved.

The analog input signal, $V_{in}$, may contain frequency components that are above the signal bandwidth of interest (e.g., baseband) but not far below the clock frequency. This may be the case in a radio system when a strong interfering signal, or "jammer", is present at a frequency somewhat outside the frequency range of the signal components of interest. In this case, some distortion may remain in the switch designs shown in FIGS. 3 through 4C and FIG. 7. The distortion may result from the gate voltage, $V_g$, and the source voltage, $V_s$, not tracking the input signal, $V_{in}$, in the same way. Input signal frequencies above the corner frequency of lowpass filter 312 will be attenuated toward $V_g$, whereas there is no such attenuation between $V_{in}$ and $V_s$, since they are connected directly. Therefore, $V_{gs}$ may not be independent of the input signal, including the interfering signal, and some residual distortion may result.

Figure 8A:
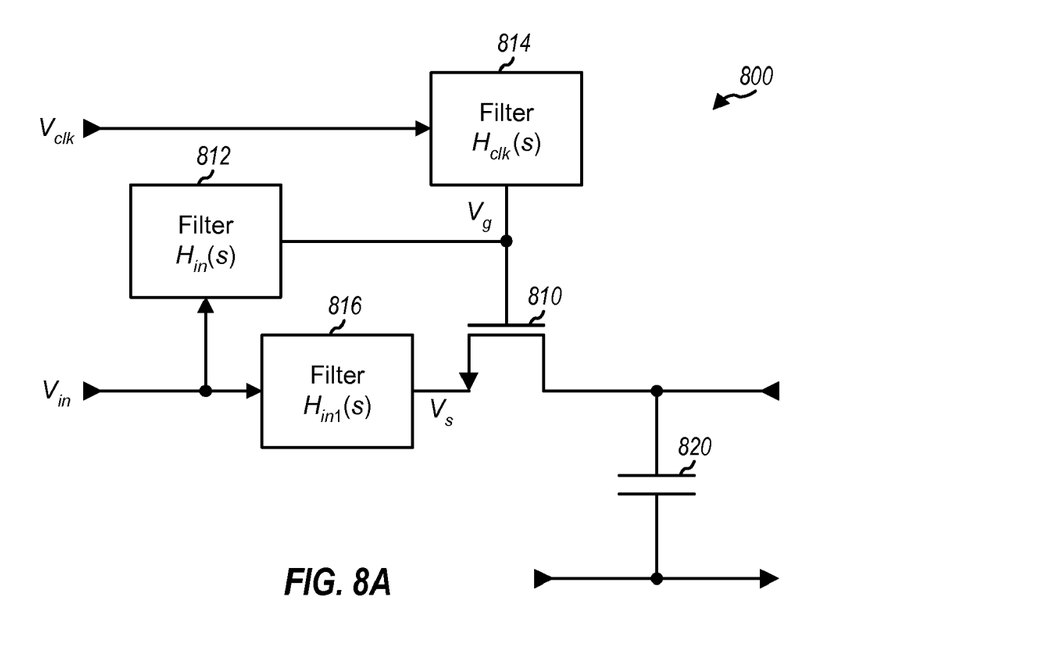
FIGS. 8A and 8B show two sampling circuits with passive bootstrap and signal filtering.

FIG. 8A shows a schematic diagram of a design of a sampling circuit 800 with passive bootstrap and signal filtering for improved switching characteristics. Sampling circuit 800 includes an N-FET 810, a capacitor 820, and filters 812 and 814 that are coupled in the same manner as N-FET 310, capacitor 320, and filters 312 and 314, respectively, in FIG. 3. Sampling circuit 800 further includes a filter 816 that receives the analog input signal, $V_{in}$, and provides a filtered input signal as the source voltage, $V_s$, of N-FET 810. Filter 816 may be designed to have a lowpass filter response similar to that of filter 812. In this case, $V_g$ is a lowpass filtered version of $V_{in}$ relative to $V_{clk}$, which results in the $V_{clk}$ superposition described above, and $V_s$ is a similar lowpass filtered version of $V_{in}$ relative to circuit ground. As a result, even high-frequency interfering signal components may not cause $V_{gs}$ to become signal dependent, and very low distortion may result for the input signal components in the desired low frequency range.

For sampling circuit 300 in FIG. 3, the corner frequency of filters 312 and 314 may be selected to meet two conditions of $f_c \gg f_{BW}$ and $f_c \ll f_{clk}$. For sampling circuit 800 in FIG. 8A, the corner frequency of filters 812, 814, and 816 may be selected to meet one condition of $f_c \ll f_{clk}$.

Figure 8B:
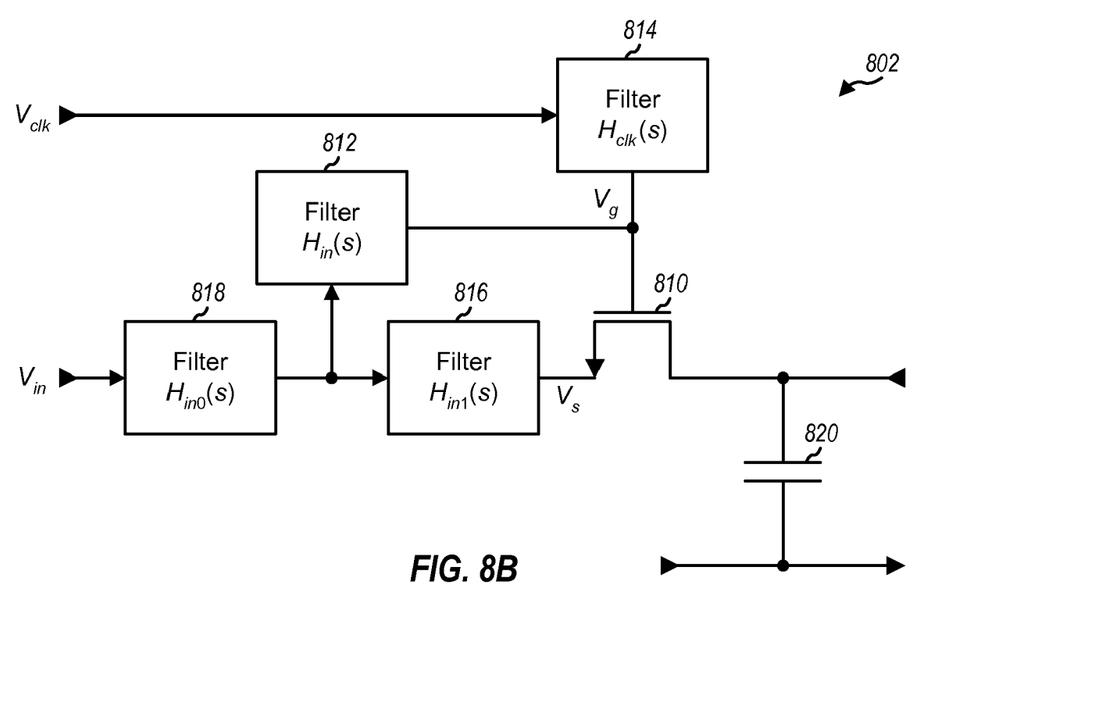

FIG. 8B shows a schematic diagram of a design of a sampling circuit 802 with passive bootstrap and signal filtering for improved switching characteristics. Sampling circuit 802 includes N-FET 810, capacitor 820, and filters 812, 814 and 816 in sampling circuit 800 in FIG. 8A. Sampling circuit 802 further includes a filter 818 that receives the analog input signal, $V_{in}$, and provides a filtered signal to both filters 812 and 816. Filter 818 may interact with filters 812 and 816 but should not disturb the property that $V_g$ and $V_s$ contain similar filtered versions of $V_{in}$.

Figure 8C:
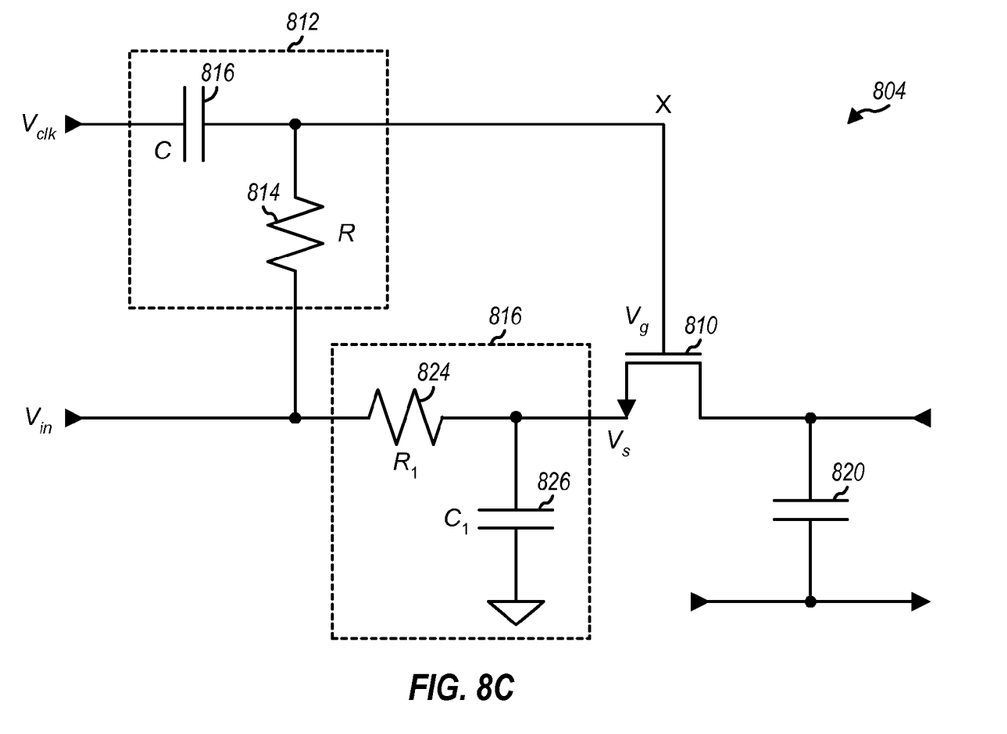
FIG. 8C shows another sampling circuit with RC passive bootstrap.

FIG. 8C shows a schematic diagram of a design of a sampling circuit 804, which is one design of sampling circuit 800 in FIG. 8A. Sampling circuit 804 implements filters 812 and 816 with first-order lowpass filters and implements filter 814 with a first-order highpass filter. Sampling circuit 804 includes N-FET 810, capacitor 820, a resistor 814, and a capacitor 816 that are coupled in similar manner as N-FET 410, capacitor 420, resistor 414, and capacitor 416, respectively, in FIG. 4A, except that $V_{in}$ is not provided directly to the source of N-FET 810. Sampling circuit 804 further includes a resistor 824 and a capacitor 826. Resistor 824 is coupled between the input signal and the source of N-FET 810. Capacitor 826 is coupled between the source of N-FET 810 and circuit ground.

Filters 812 and 814 are realized with a single R and C combination, as described above for FIG. 4A. Filter 816 is implemented with an RC filter formed by resistor 824 and capacitor 826. The RC product of filter 812 may be approximately equal to the $R_1C_1$ product of filter 816 to achieve similar frequency responses for filters 812 and 816.

N-FET 810 followed by the periodically reset capacitor 820 represent a resistance of approximately $1/(f_{clk} \cdot C)$ at low frequencies $f_{in} \ll f_{clk}$. This unintended resistance is seen by the source of NFET 810 when it is on and may alter the response of filter 816. The switch performance may be improved by modeling this resistance in the path with filter 812. For example, in FIG. 8C, an equivalent resistor may be added in parallel with capacitor 816, or resistor 814 may be raised to account for the unintended resistance.

FIGS. 3 through 8C show some designs of switches with passive bootstrap. Passive bootstrap may also be implemented in other manners, e.g., with other filters and/or other filter implementations.

The switches with passive bootstrap described herein may be used for various circuits and applications. For example, these switches may be used for switch circuits, switched capacitor filters, analog-to-digital converters (ADCs), digital-to-analog converters (DACs), etc. An example use of these switches for a switch circuit is described below.

Figure 9:
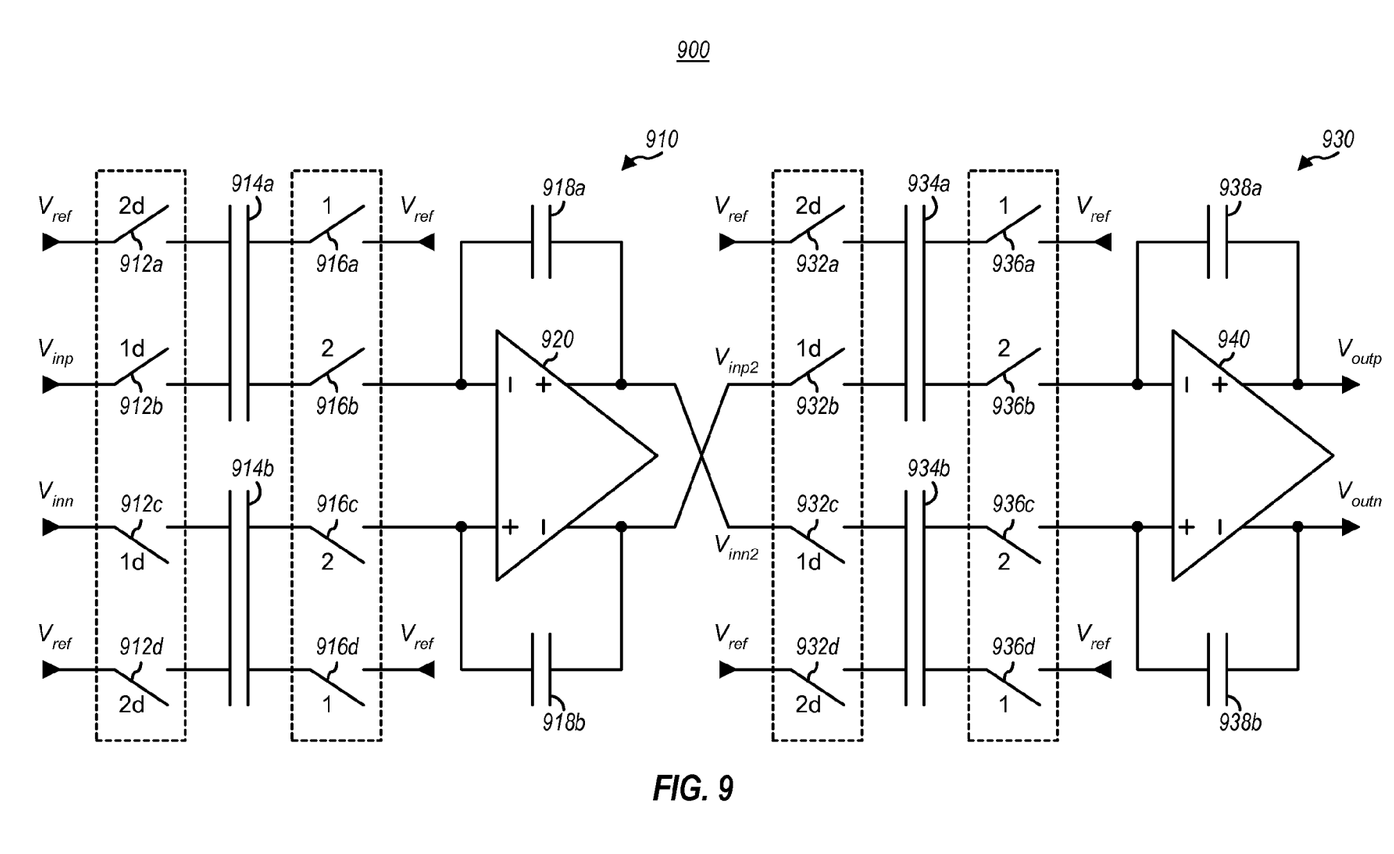
FIG. 9 shows an analog-to-digital converter (ADC) switch circuit.

FIG. 9 shows a schematic diagram of a design of an ADC switch circuit 900. Switch circuit 900 includes two stages 910 and 930 that are coupled in cascade. Within first stage 910, a switch 912a couples a reference voltage, $V_{ref}$, to a first end of a capacitor 914a during a delayed second clock phase, '2d'. A switch 912b couples a non-inverting input signal, $V_{inp}$, to the first end of capacitor 914a during a delay first clock phase, '1d'. A switch 912c couples an inverting input signal, $V_{inn}$, to a first end of a capacitor 914b during the delay first clock phase. A switch 912d couples the reference voltage to the first end of capacitor 914b during the delayed second clock phase.

A switch 916a couples the reference voltage to a second end of capacitor 914a during the first clock phase, '1'. A switch 916b couples the second end of capacitor 914a to an inverting input of an amplifier 920 during a second clock phase, '2'. A switch 916c couples the second end of capacitor 914b to a non-inverting input of amplifier 920 during the second clock phase. A switch 916d couples the reference voltage to the second end of capacitor 914b during the first clock phase.

A capacitor 918a couples between a non-inverting output and the inverting input of amplifier 920. A capacitor 918b couples between an inverting output and the non-inverting input of amplifier 920. The non-inverting and inverting outputs of amplifier 920 are provided as the inverting and non-inverting inputs of second stage 930. Within second stage 930, switches 932 and 936, capacitors 934 and 938, and amplifier 940 are coupled in the same manner as switches 912 and 916, capacitors 914 and 918, and amplifier 920, respectively, in first stage 910.

Within first stage 910, capacitors 914a and 914b are charged by the non-inverting and inverting input signals, respectively, during the first clock phase. Capacitors 914a and 914b provide their charged voltages to the inverting and non-inverting inputs of amplifier 920 during the second clock phase. Capacitors 934a and 934b in second stage 930 are charged in similar manner as capacitors 914a and 914b in first stage 910. The clock signals for switches 912 and 932 may be delayed slightly relative to the clock signals for switches 916 and 936. Phase-one delay on switches 912b and 912c relative to switches 916a and 916d avoids signal-dependent charge injection onto the capacitors during the opening of switches 912b and 912c. In this case, switches 912a and 912d open in advance, causing a fixed charge injection error only, since these switches connect to $V_{ref}$, independent of $V_{in}$. Once the capacitors are floating, opening of switches 912b and 912c is unable to impart additional charge onto the capacitors. A phase-two similar timing is adopted to avoid any clock overlapping on either the front or the back plates of the capacitors.

Switches 912b and 912c are input sampling switches that receive the non-inverting and inverting input signals, respectively, for ADC switch circuit 900. Switches 912b and 912c may have higher performance requirements than the remaining switches in circuit 900 and may be implemented with passive bootstrap.

Figure 10:
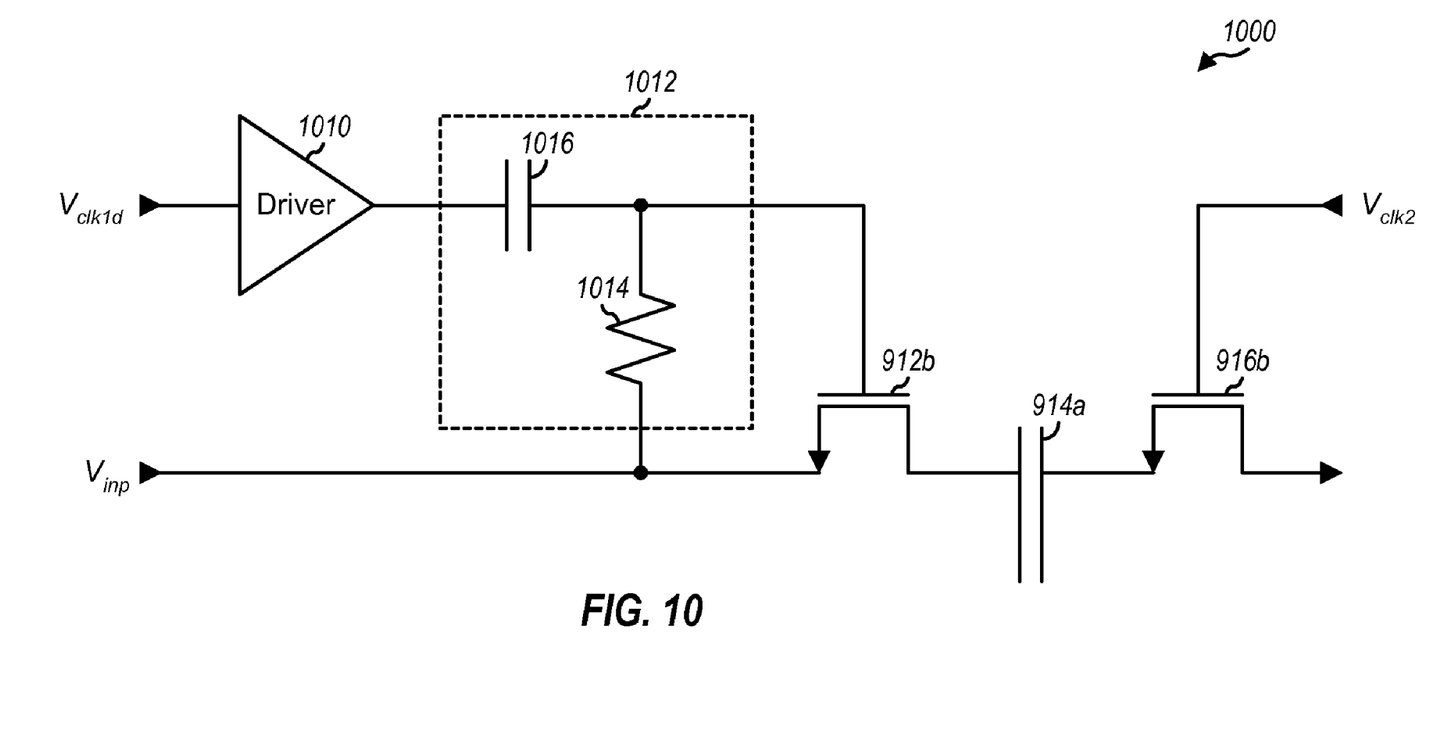
FIG. 10 shows a sampling circuit for one switch in FIG. 9.

FIG. 10 shows a schematic diagram of a sampling circuit 1000 with passive bootstrap. Sampling circuit 1000 may be used for switch 912b in FIG. 9 (as shown in FIG. 10) and also for switch 912c (not shown in FIG. 10). Sampling circuit 1000 includes a driver 1010 and a bootstrap circuit 1012. Driver 1010 receives a clock signal and provides a boosted clock signal having a larger voltage swing. Bootstrap circuit 1012 includes a resistor 1014 and a capacitor 1016. Resistor 1014 couples across the source and gate of N-FET 912b. Capacitor 1016 couples between the output of driver 1010 and the gate of N-FET 912b. Bootstrap circuit 1012 generates the gate voltage for N-FET 912b in the manner described above.

The switches described herein may be used for various applications such as communication, networking, computing, consumer electronics, etc. The switches may be used for cellular phones, personal digital assistants (PDAs), wireless communication devices, handheld devices, wireless modems, laptop computers, cordless phones, etc. The switches may also be implemented with various types of transistors such as MOSFET, N-FETs, P-FETs, BJTs, GaAs FETs, etc. These switches may also be fabricated in various IC processes. The switches may be used for various types of IC such as RF ICs (RFICs), mixed-signal ICs, application specific integrated circuits (ASICs), etc.

An apparatus implementing the switches described herein may be a stand-alone unit or may be part of a device. The device may be (i) a stand-alone IC, (ii) a set of one or more ICs that may include memory ICs for storing data and/or instructions, (iii) an ASIC such as a mobile station modem (MSM), (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
a first filter configured to filter an input signal and provide a filtered input signal;
a second filter configured to filter a clock signal and provide a filtered clock signal, wherein the first filter is a lowpass filter having a first corner frequency that is higher than a bandwidth of the input signal and the second filter is a highpass filter having a second corner frequency that is lower than a fundamental frequency of the clock signal; and
a switch configured to receive a control signal formed based on the filtered input signal and the filtered clock signal and to pass or block the input signal based on the control signal.

2. The apparatus of claim 1, wherein the first corner frequency is equal to the second corner frequency.

3. The apparatus of claim 1, wherein the fundamental frequency is at least ten times higher than the bandwidth of the input signal.

4. The apparatus of claim 1, wherein the first filter is implemented with a resistor and a capacitor, and wherein the second filter is implemented with the resistor and the capacitor used for the first filter.

5. The apparatus of claim 4, wherein the resistor is coupled between a source and a gate of the switch, the capacitor is coupled between the gate of the switch and the clock signal, and the input signal is coupled to the source of the switch.

6. The apparatus of claim 4, wherein the resistor is coupled between a drain and a gate of the switch, the capacitor is coupled between the gate of the switch and the clock signal, and the input signal is coupled to a source of the switch.

7. The apparatus of claim 1, further comprising:
a third filter configured to filter the input signal and provide a second filtered input signal, and wherein the switch is configured to pass or block the second filtered input signal based on the control signal.

8. The apparatus of claim 7, wherein the first and third filters have similar frequency responses.

9. The apparatus of claim 7, further comprising:
a fourth filter configured to filter the input signal and provide a third filtered input signal, and wherein the first and third filters are configured to receive and filter the third filtered input signal.

10. The apparatus of claim 1, wherein the control signal is a voltage sum of the filtered input signal and the filtered clock signal.

11. The apparatus of claim 1, wherein the control signal has a higher voltage swing than the clock signal.

12. The apparatus of claim 1, wherein the switch is configured to receive the input signal at a source and the control signal at a gate, and wherein a gate-to-source voltage of the switch is non-dependent on the input signal.

13. The apparatus of claim 1, further comprising:
a driver configured to receive the clock signal and provide a boosted clock signal having a larger voltage swing than the clock signal, and wherein the second filter is configured to filter the boosted clock signal.

14. The apparatus of claim 1, further comprising:
a capacitor having a first end coupled to the switch;
a second switch coupled between the first end of the capacitor and a reference voltage;
a third switch coupled between a second end of the capacitor and the reference voltage; and
a fourth switch coupled to the second end of the capacitor and providing an output signal.

15. The apparatus of claim 14, wherein the switch and the third switch are turned on during a first phase of the clock signal, and wherein the second and fourth switches are turned on during a second phase of the clock signal.

16. The apparatus of claim 14, wherein the switch is turned on during a delayed first phase of the clock signal, the second switch is turned on during a delayed second phase of the clock signal, the third switch is turned on during a first phase of the clock signal, the fourth switch is turned on during a second phase of the clock signal.

17. The apparatus of claim 1, wherein the switch is implemented with a metal oxide semiconductor field effect transistor (MOSFET).

18. The apparatus of claim 1, wherein the switch is implemented with an N-channel field effect transistor (N-FET) or a P-channel FET (P-FET).

19. An integrated circuit comprising:
a first filter configured to filter an input signal and provide a filtered input signal;
a second filter configured to filter a clock signal and provide a filtered clock signals, wherein the first filter is a lowpass filter having a first corner frequency that is higher than a bandwidth of the input signal and the second filter is a highpass filter having a second corner frequency that is lower than a fundamental frequency of the clock signal; and
a switch configured to receive a control signal formed based on the filtered input signal and the filtered clock signal and to pass or block the input signal based on the control signal.

20. The integrated circuit of claim 19, wherein the first filter is implemented with a resistor and a capacitor, and wherein the second filter is implemented with the resistor and the capacitor used for the first filter.

21. The integrated circuit of claim 20, wherein the resistor is coupled between a source and a gate of the switch, the capacitor is coupled between the gate of the switch and the clock signal, and the input signal is coupled to the source of the switch.

22. The integrated circuit of claim 19, further comprising:
a capacitor having a first end coupled to the switch;
a second switch coupled between the first end of the capacitor and a reference voltage;
a third switch coupled between a second end of the capacitor and the reference voltage; and
a fourth switch coupled to the second end of the capacitor and providing an output signal.

23. An integrated circuit comprising:
a field effect transistor (FET) having a source, a drain, and a gate and configured to receive an input signal at the source;
a resistor coupled between the source and the gate of the FET; and
a capacitor having a first end coupled to the gate of the FET and a second end configured to receive a clock signal;
wherein the FET, the resistor, and the capacitor are configured to:
form a lowpass filter to filter the input signal to obtain a filtered input signal;
form a highpass filter to filter the clock signal to obtain a filtered clock signal, wherein the lowpass filter has a first corner frequency that is higher than a bandwidth of the input signal and the highpass filter has a second corner frequency that is lower than a fundamental frequency of the clock signal;
combine the filtered input signal and the filtered clock signal into a control signal; and
to pass or block the input signal to the drain based on the control signal.

24. An apparatus comprising:
means for filtering an input signal with a lowpass filter response to obtain a filtered input signal, wherein the lowpass filter response has a lowpass corner frequency that is higher than a bandwidth of the input signal;
means for filtering a clock signal with a highpass filter response to obtain a filtered clock signal, wherein the highpass filter response has a highpass corner frequency that is lower than a fundamental frequency of the clock signal; and
means for controlling a switch to pass or block the input signal with a control signal formed based on the filtered input signal and the filtered clock signal.

25. A method comprising:
filtering an input signal with a lowpass filter response to obtain a filtered input signal, wherein the lowpass filter response has a lowpass corner frequency that is higher than a bandwidth of the input signal;
filtering a clock signal with a highpass filter response to obtain a filtered clock signal, wherein the highpass filter response has a highpass corner frequency that is lower than a fundamental frequency of the clock signal; and
controlling a switch to pass or block the input signal with a control signal formed based on the filtered input signal and the filtered clock signal.

26. A method comprising steps of:
receiving a sampling signal;
receiving an input signal;
filtering the sampling signal to attenuate the sampling signal at an input of the switch, wherein the step of filtering the sampling signal comprises applying a passive highpass filter to the sampling signal, the passive highpass filter having a corner frequency lower than a frequency of the sampling signal;
bootstrapping the sampling signal with the input signal to obtain a control signal; and
applying the control signal to a control input of a switch selectively to pass or block the input signal through the switch based on the control signal.

27. An apparatus comprising:
a switch comprising a signal input, a signal output, and a control input;
a circuit input configured to receive an input signal;
a sampling signal input configured to receive a sampling signal; and
a highpass filter configured to filter the sampling signal, the highpass filter having a corner frequency lower than a frequency of the sampling signal;
wherein the filter, the circuit input, the circuit output, and the switch are configured to:

bootstrap the sampling signal with the input signal to provide a bootstrapped control signal; and apply the control signal to the control input of the switch to selectively pass or block the input signal through the switch based on the control signal.

28. The apparatus of claim 27, wherein:

the highpass filter is a passive filter; and the highpass filter, the circuit input, the circuit output, and the switch are further configured to attenuate the sampling signal at the input of the switch.

29. An apparatus comprising:

means for switching comprising a signal input, a signal output, and a control input;

means for receiving an input signal coupled to the signal input; and means for filtering the input signal to attenuate the input signal by applying a passive lowpass filter to the input signal, the passive lowpass filter having a corner frequency higher than a bandwidth of the input signal;

means for bootstrapping a sampling signal with the input signal to obtain a control signal and provide the control signal at the control input;

wherein the means for switching is configured to selectively pass the input signal to the signal output or block the input signal from passing to the signal output based on the control signal.

30. The apparatus of claim 29, wherein the means for boostrapping is configured to attenuate the sampling signal at the signal input.

* * * * *